US011077755B2

United States Patent
Pennisi et al.

(10) Patent No.: US 11,077,755 B2
(45) Date of Patent: Aug. 3, 2021

(54) SELF-TEST CIRCUIT, AND CORRESPONDING DEVICE, VEHICLE AND METHOD

(71) Applicant: STMicroelectronics S.r.l., Agrate Brianza (IT)

(72) Inventors: Orazio Pennisi, Pieve Emanuele (IT); Valerio Bendotti, Vilminore di Scalve (IT); Vanni Poletto, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 81 days.

(21) Appl. No.: 16/420,875

(22) Filed: May 23, 2019

(65) Prior Publication Data
US 2019/0366849 A1 Dec. 5, 2019

(30) Foreign Application Priority Data
May 29, 2018 (IT) .................. 102018000005810

(51) Int. Cl.
*B60L 3/00* (2019.01)
*G01R 31/385* (2019.01)
(Continued)

(52) U.S. Cl.
CPC .............. *B60L 3/0046* (2013.01); *B60L 50/64* (2019.02); *G01R 31/386* (2019.01); *H02J 7/0021* (2013.01); *H03M 3/458* (2013.01)

(58) Field of Classification Search
CPC ..... B60L 3/0046; B60L 50/64; G01R 31/386; G01R 31/396; G01R 31/385;
(Continued)

(56) References Cited

U.S. PATENT DOCUMENTS 4,258,421 A * 3/1981 Juhasz .................. G07C 5/085
340/870.16
4,678,998 A * 7/1987 Muramatsu ........ G01R 31/3648
324/427
(Continued)

FOREIGN PATENT DOCUMENTS

CN 102097834 A 6/2011
CN 105277824 A 1/2016
(Continued)

OTHER PUBLICATIONS

RT, E., CB, C., Logic, S. and Interface, S., Lithium Ion Battery Monitoring System AD7280A. Lithium Ion Battery Monitoring System AD7280A. Distributor of Analog Devices Inc.: Excellent Integrated System Limited Datasheet of AD7280ABSTZ-RL-IC Battery Monitor Li-Ion 48LQFP (Year: 2011).*

*Primary Examiner* — Christopher P McAndrew
(74) *Attorney, Agent, or Firm* — Slater Matsil, LLP

(57) ABSTRACT

A circuit includes a differential stage configured to provide a differential output signal. An analog-to-digital converter is coupled to first and second output nodes of the differential stage. The analog-to-digital converter is configured to provide an output signal that is a function of the differential output signal from the differential stage. A multiplexer is configured to receive a differential input signal. The multiplexer includes a test switch switchable between a conductive state and a non-conductive state. In the conductive state, the test switch couples the first input node and the second input node of the differential stage. Test signal injection circuitry is activatable to force a differential current through the differential stage. The circuit is selectively switchable between an operational mode and a self-test mode.

21 Claims, 4 Drawing Sheets

(51) Int. Cl.
  *B60L 50/64*  (2019.01)
  *H02J 7/00*  (2006.01)
  *H03M 3/00*  (2006.01)
(58) Field of Classification Search
  CPC ....... G01R 31/006; G01R 1/30; H02J 7/0021; H03M 3/458; H03M 1/66; Y02T 10/70
  USPC .......................................................... 324/433
  See application file for complete search history.

(56) References Cited

U.S. PATENT DOCUMENTS

| | | | | |
|---|---|---|---|---|
| 5,450,321 | A | * | 9/1995 | Crane ................. B60R 16/0231 701/31.6 |
| 5,969,625 | A | * | 10/1999 | Russo ................... G01R 31/389 340/636.19 |
| 6,031,354 | A | * | 2/2000 | Wiley ................. H01M 10/441 320/116 |
| 6,697,763 | B1 | * | 2/2004 | Wilkins .................... F02F 3/10 326/27 |
| 8,030,881 | B2 | * | 10/2011 | Owens, Jr. ............ H02J 7/1438 320/104 |
| 2005/0242980 | A1 | | 11/2005 | Collins et al. |
| 2010/0134068 | A1 | | 6/2010 | Lim |
| 2014/0197841 | A1 | * | 7/2014 | Mizoguchi ............ B60L 3/0046 324/434 |
| 2016/0084914 | A1 | | 3/2016 | Bernardon |
| 2017/0184682 | A1 | * | 6/2017 | Lee ......................... B60L 58/18 |
| 2017/0254854 | A1 | | 9/2017 | Honda |
| 2019/0366849 | A1 | | 12/2019 | Pennisi et al. |

FOREIGN PATENT DOCUMENTS

| | | |
|---|---|---|
| CN | 105438105 A | 3/2016 |
| CN | 211318696 U | 8/2020 |
| EP | 3032693 B1 | 1/2017 |

* cited by examiner

SELF-TEST CIRCUIT, AND CORRESPONDING DEVICE, VEHICLE AND METHOD

CROSS-REFERENCE TO RELATED APPLICATIONS

This application claims priority to Italian Patent Application No. 102018000005810, filed on May 29, 2018, which application is hereby incorporated herein by reference.

TECHNICAL FIELD

The description relates to self-test circuits.

BACKGROUND

The evolving technology of electric vehicles (EVs) and hybrid electric vehicles (HEVs) makes improved performance of battery management systems (BMSs) a desirable feature in order to facilitate safe, reliable and cost-efficient battery operation.

A task of a battery management system (BMS) involves measuring the voltages of individual battery cells. This may involve extracting relatively small differential voltages from (very) high common mode voltages.

Also, a factor to be taken into account in automotive applications is the noisy nature of a vehicle environment, with, for instance, electromagnetic interference occurring over a wide range of frequencies. This may give rise to an undesired loss of accuracy which may adversely affect battery pack longevity and performance.

Accuracy measurement can be facilitated by placing differential voltage amplifiers with a high CMRR (Common Mode Rejection Ratio) at each cell to provide (for instance, level-shifted) voltages signals which can be fed to an analog-to-digital converter (ADC) to be digitized.

Such arrangements may include various other features, for instance, for protection and diagnostic purposes. Open load detection, leakage detection, built-in self-test (BIST) are exemplary of such options which are desirable in order to facilitate satisfying safety requirements in areas such as the automotive area.

Despite the intensive activity in that area, further improved solutions are desirable.

This applies, for instance, to the capability of performing "running" tests aimed at detecting errors occurring in a processing chain including various elements such as, for instance, multiplexers, level shifters, references signal generators, analog-to-digital converters.

SUMMARY

One or more embodiments can contribute in providing improved solutions.

One or more embodiments may relate to a corresponding device, for instance, a battery management system or BMS.

One or more embodiments may relate to a vehicle (for instance, a motor vehicle such as an EV or a HEV) equipped with such a device.

One or more embodiments may facilitate achieving one or more of the following advantages: a circuit architecture can be provided which facilitates exploring a plurality of input characteristics; an input signal for built-in self-test (BIST) can be generated as a low-voltage signal, thus saving a circuit area; high-accuracy in BIST signal voltage conversion is facilitated; and improved accuracy may be achieved in comparison to conventional, for instance, Zener-based solutions.

In one or more embodiments, an analog-to-digital converter is provided capable of comparing a current reference with a desired current which emulates an input differential voltage, thus facilitating checking performance of the full processing chain involved.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

In the figures, reference 10 designates as a whole a circuit configured to include a built-in self-test (BIST) feature as discussed in the following.

In one or more embodiments, the circuit 10 may be adapted to sense (measure) an input voltage DV/HV.

Such a designation is intended to highlight the fact that one or more embodiments may be applied to sensing/measuring a small differential voltage extracted from a (very) high common mode voltage (HV).

One or more embodiments may be applied to providing information corresponding to the voltage DV as a digitally-encoded signal CODE for use in various processing applications generally designated P.

Figure 4:
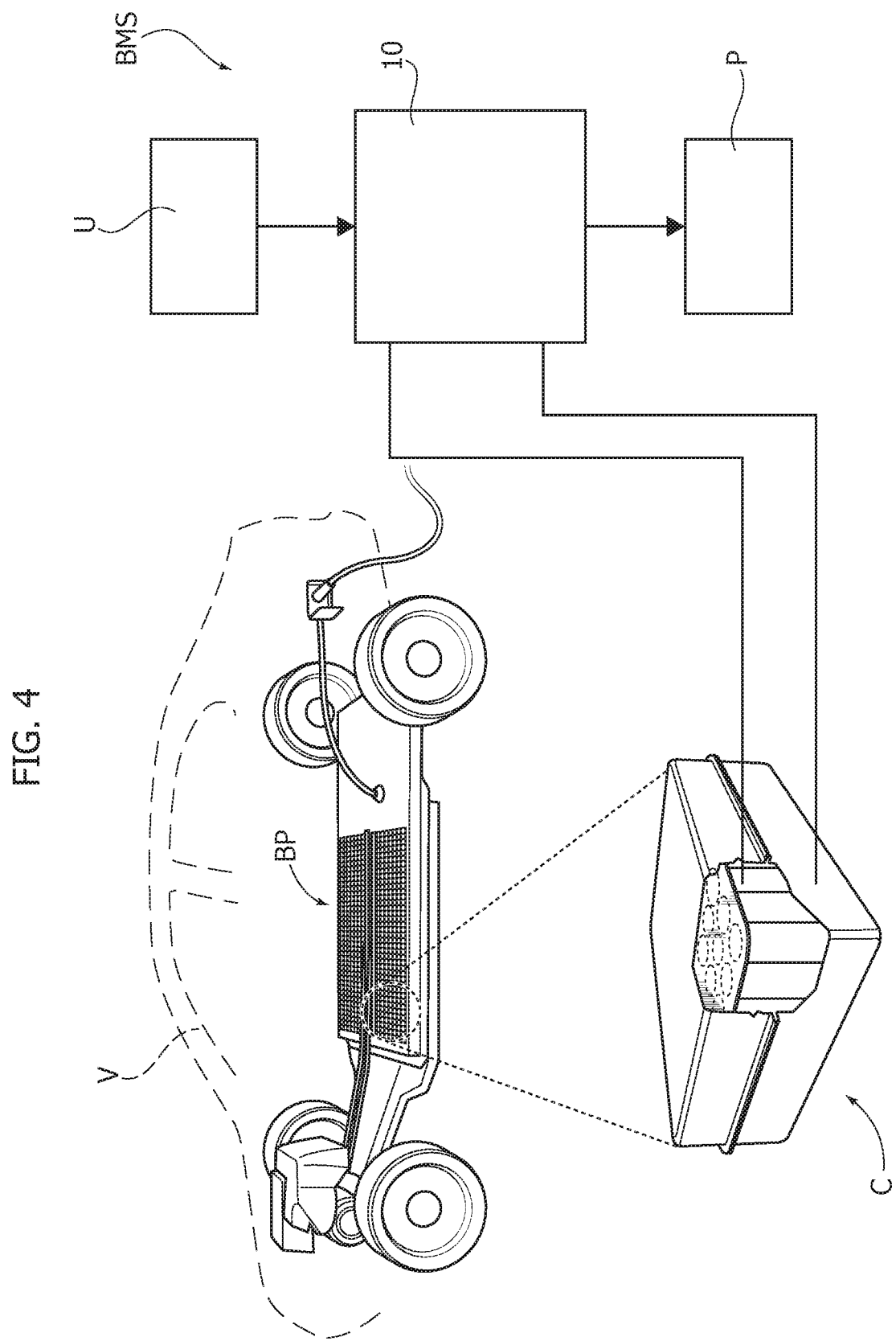

As exemplified in FIG. 4, a circuit 10 as exemplified herein may be associated, for instance, to a battery management system (BMS) in a vehicle V such as an electric vehicle (EV) or a hybrid electric vehicle (HEV) for sensing the voltages at the battery cells C of the battery pack BP equipping the vehicle V.

Reference to such a possible application is not however to be understood in a limiting sense of embodiments.

In one or more embodiments as exemplified herein, the circuit 10 may comprise an input multiplexer 12 followed by a (differential) voltage level shift stage 14 which produces an output (voltage) signal $V_{diff}$ applied to an (for instance, sigma-delta) analog-to-digital converter (ADC) 16.

The ADC 16 is sensitive to a reference (voltage) signal $V_{BG}$ and produces an output signal $V_{out}$ in the form of a digital bitstream whose average value is a function of the ratio of the input signal $\T_M$ to the reference $V_{BG}$.

Reference 18 indicates a digital filter active on the signal $V_{out}$ to produce the signal CODE as a digital version of the average value indicative of the input voltage DV (for instance, a small differential voltage DV over a high common mode voltage HV).

Save for what is discussed in detail in the following, the elements in the circuit layout exemplified in FIG. 1 can be regarded as conventional in the art, thus making it unnecessary to provide a more detailed description herein.

Figure 1:
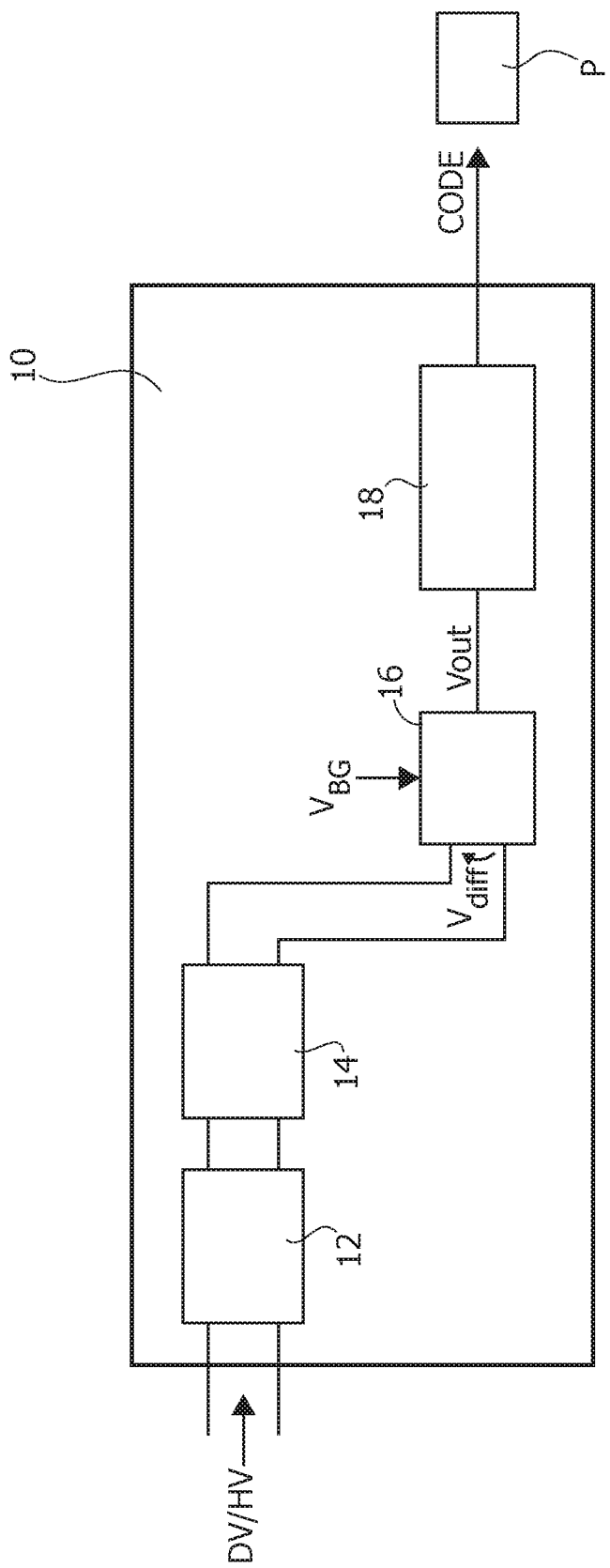
FIG. 1 is a block diagram exemplary of a possible context of use of embodiments.

An approach for checking correct operation of a circuit 10 as exemplified in FIG. 1 may involve, for instance, supplying a test signal from a self-test pattern generator to the digital filter 18 to check the correct operation thereof: this amounts to a check performed on the digital path only.

Alternatively, a full check may be applied to the processing chain exemplified in FIG. 1 by using a Zener voltage reference connected (for instance, via the multiplexer 12) as an input to the differential stage 14.

A drawback of such an approach lies in that only a point value of the differential input voltage can be checked while the differential voltage DV may exhibit a functional range of, for instance, 0-5 V.

Figure 2:
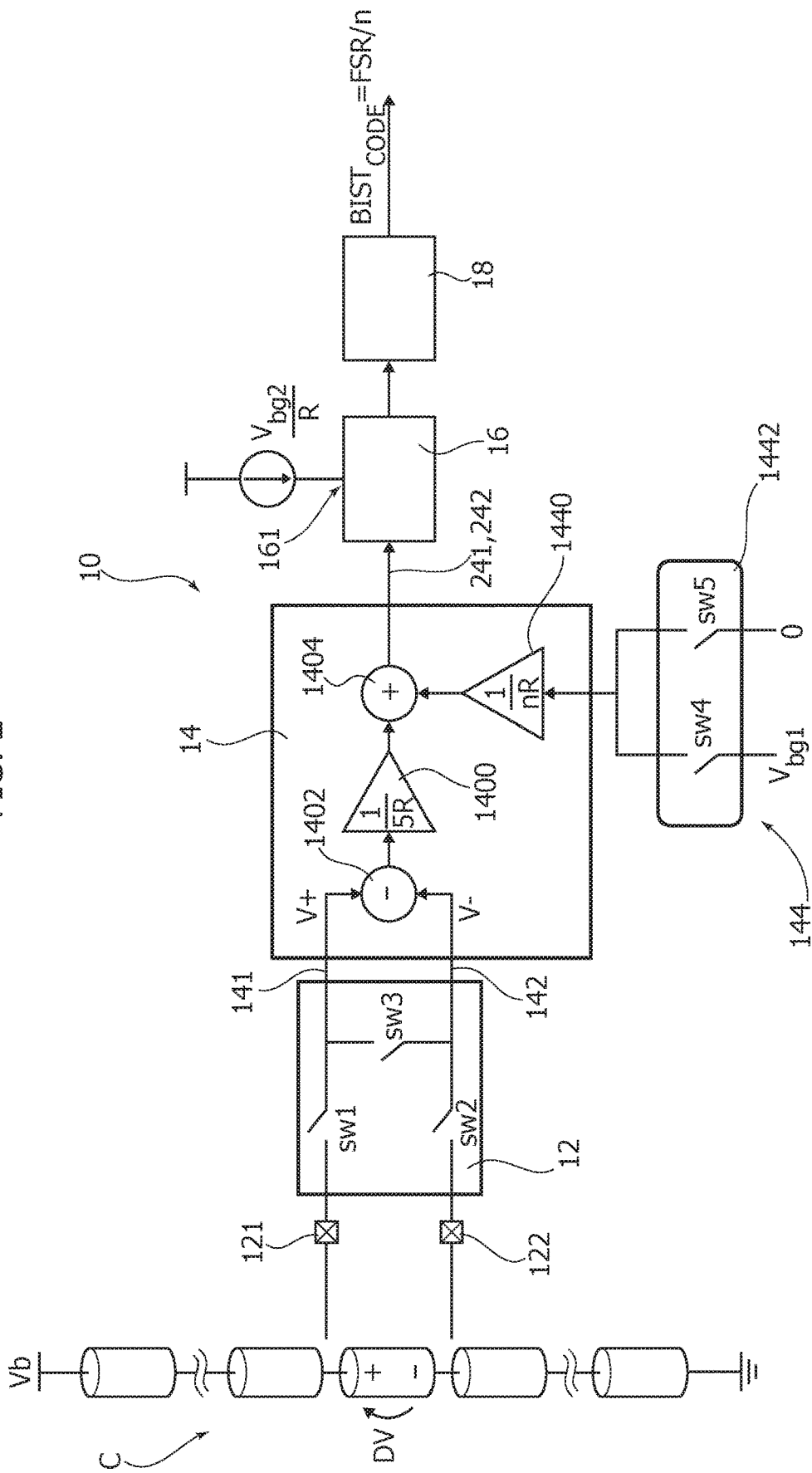
FIG. 2 is a functional block diagram exemplary of embodiments.
Figure 3:
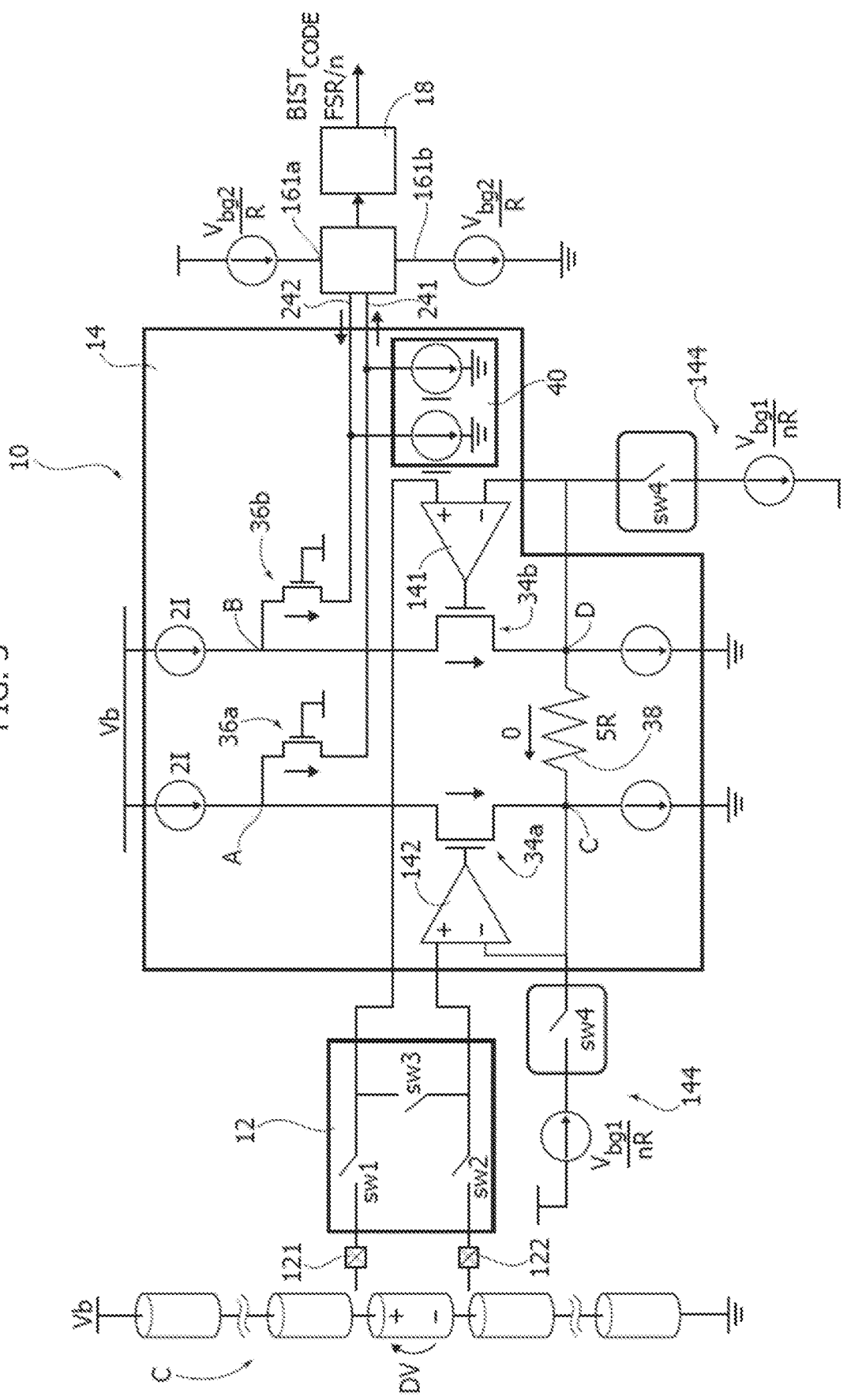
FIG. 3 is a circuit diagram exemplary of embodiments, and FIG. 4 further illustrates a possible context of use of embodiments.

FIGS. 2 and 3 are exemplary of an approach adapted to be used in one or more embodiments to provide a circuit such as the circuit 10 with a built-in self-test (BIST) feature.

In one or more embodiments as exemplified in FIGS. 2 and 3 the multiplexer 12 comprises a first input terminal 121 and a second input terminal 122 configured to receive therebetween the differential voltage DV to be sensed (measured). As noted, this may be, for instance, a voltage as sensed across one of the battery cells C in a battery pack BP equipping a vehicle V such as an EV or HEV.

In one or more embodiments as exemplified in FIGS. 2 and 3, the multiplexer 12 includes a first switch sw1 switchable between a conductive state and a non-conductive state. As a result of being in the conductive state ("on"), the first switch sw1 couples the first input terminal 121 of the multiplexer 12 with a first input node 141 of the differential (voltage level shift) stage 14. As a result of the first switch sw1 being in the non-conductive state ("off") the first input terminal 121 of the multiplexer 12 and the first input node 141 of the differential stage 14 are mutually isolated.

In one or more embodiments as exemplified in FIGS. 2 and 3, the multiplexer 12 includes a second switch sw2 switchable between a conductive state and a non-conductive state. As a result of being in the conductive state ("on"), the second switch sw2 couples the second input terminal 122 of the multiplexer 12 with a second input node 142 of the stage 14. As a result of the second switch sw2 being in the non-conductive state ("off") the second input terminal 121 of the multiplexer 12 and the second input node 142 of the differential stage 14 are mutually isolated.

In one or more embodiments as exemplified in FIGS. 2 and 3, the multiplexer 12 includes a third switch sw3 switchable between a conductive state and a non-conductive state. As a result of being in the conductive state ("on"), the third switch sw3 couples ("shorts") the first input node 141 and second input node 142 of the stage 14. As a result of the third switch sw3 being in the non-conductive state ("off") the first input node 141 and second input node 142 of the stage 14 are mutually isolated.

Also, as a result of the first switch sw1 and the third switch sw3 being in the conductive state ("on") with the second switch sw2 in the non-conductive state ("off") the first input terminal 121 of the multiplexer 12 is coupled to both the first input node 141 and second input node 142 of the stage 14.

As exemplified in the block diagram of FIG. 2, in one or more embodiments the differential stage 14 may include a voltage level shifter block 1400 configured to apply a level shifting gain (for instance, 1/5R) to the differential voltage between the first input terminal 121 and the second input terminal 122 as transferred via the switches sw1, sw2 (when conductive) of the multiplexer 12 to the input nodes 141 and 142 of the stage 14.

This type of operation (corresponding to the normal operation of the circuit) is exemplified in FIG. 2 by showing the input nodes 141 and 142 of the stage 14 coupled (with opposes signs, "+" and "−") to a summation node 1402 in turn supplying the level shifter block 1400.

In such an operational mode the ADC 16 may compare $V_{diff}/5R$ with a reference value applied at 161, for instance, $V_{bg2}/R$. By way of example, this may be a (known) bandgap voltage of about 1.2V with a cell voltage range of, for instance, 0V to 5V.

Reference to a resistor with a resistance value equal to 5R indicates that all that range can be covered, with the full scale range (FSR—that is, the maximum input differential voltage that can be applied in order to avoid the saturation of the stage) equal to for instance, 1.2V*5R/R=6V.

The absolute value of R (which facilitates converting a differential voltage into a differential current) does not affect the output CODE: see the right hand side of FIGS. 2 and 3, the output CODE being independent of this value.

A judicious choice of that value facilitates having a current in the microampere (uA) range.

For example, in order to have a maximum signal current equal to 50 uA, a resistor with a resistance value equal to R=$V_{diff\_max}$/I=6V/50 uA=120 kOhm can be selected, so that, in the functional mode considered herein, CODE can be evaluated as:

CODE=$[(V_{bg2}/R)/(V_{diff}/5R)]*2^{\hat{}}$mbit, where mbit is the number of bits used.

It will otherwise be appreciated that the quantitative values indicated are merely exemplary and non-limiting of embodiments.

In FIG. 2, reference 1404 designates a summation node where the output from the block 1400 is summed with the signal from another gain stage 1440 (with gain 1/nR) receiving input from a switch block 1442. As exemplified in FIG. 2, the switch block 1442 may include a fourth switch sw4 and a fifth switch sw5 which may couple to the stage 1440 either a reference—for instance, bandgap—voltage $V_{bg1}$ (for test purposes) or a 0 voltage.

In one or more embodiments, the switches sw1 to sw5 as exemplified herein may comprise electronic switches, for instance, MOSFET transistors.

Operation of the switches sw1 to sw5, that is, switching between the conductive ("on") state and the non-conductive ("off") state can be controlled, in a manner known per se, by logic circuitry not visible in the figures for simplicity of representation.

Such logic circuitry enables switching to a test mode (built-in self-test or BIST). A BIST mode may be activated when desirable, for instance, BIST can be performed on demand, in case of failure involving battery cell measurement (for instance, under/over voltage), at certain specified time intervals between two BIST acts, and so on. For instance, a BIST code can be compared with two thresholds written in the logic, with BIST failure possibly transmitted to the control unit U (for instance, a microcontroller): see FIG. 4.

As discussed in the following, in a self-test or BIST mode the ADC 16 may compare $V_{bg1}/nR$ (that is the output from the gain stage 1440) with the reference $V_{bg2}/R$. By assuming (reasonably) for the sake of simplicity that $V_{bg1}$ and $V_{bg2}$ are two identical bandgap voltages their ratio will depend (only) on n.

In that case (BIST), the output CODE can be evaluated as:

$$\text{CODE} = [(V_{bg2}/R)/(V_{bg1}/nR)] * 2^{\wedge}\text{mbit} = (1/n) * 2^{\wedge}\text{mbit}.$$

This facilitates "emulating" in the test mode the presence of an input differential voltage equal to $V_{bg1}*n$.

The possibility will thus exist of varying (for instance, under the control logic as discussed previously) the value for n and selecting a certain characteristic input point or exploring an input characteristic curve for (self)test purposes.

The elements 1440 and 1442 are exemplary of test signal injection circuitry 144 activatable (for instance, as discussed in the following) to force through the differential stage 14 a current intended to emulate for test purposes an input differential voltage to the circuit 10.

In one or more embodiments, with the stage 1440 coupled to a 0 input voltage via the switch sw5, the signal applied to the node 1040 by the stage 1440 can be zeroed during "normal" operation as discussed previously, that is with the differential voltage DV between the first input terminal 121 and the second input terminal 122 of the multiplexer 12 transferred via the switches sw1, sw2 (conductive) to the input nodes 141 and 142 of the stage 14.

Conversely, with the reference voltage $V_{bg1}$ coupled to the stage 1440 for test purposes via the switch sw4 made conductive, the stage 1440 will inject a non-zero signal $V_{bg1}/nR$ into the node 1404, while the differential input to the stage 14 will be zeroed as a result of the third switch sw3 being brought to the conductive state ("on") and thus shorting the inputs 141, 142. Also, the first switch sw1 and the third switch sw3 being brought to the conductive state ("on") with the second switch sw2 in the non-conductive state ("off") will cause the first input terminal 121 of the multiplexer 12 to be coupled to both the first input node 141 and second input node 142 of the stage 14 so that the common mode voltage associated therewith (for instance, HV) is applied to the first input node 141 of the stage 14.

As noted, the elements 1400, 1442 and 1404 in FIG. 2 can be regarded as exemplary of a test signal injection circuitry 144 activatable (for instance, via the switch sw4) to force through the differential stage 14 a current "emulating" for test purposes (BIST mode) a—possibly variable or "sweepable"—differential voltage between the input terminals 121, 122 of the multiplexer 12 transferred to the input nodes 141, 142 of the stage 14 (shorted by the switch sw3 in the test mode).

It will be otherwise appreciated that FIG. 2 is intended to provide a "high-level" functional block diagram of one or more embodiments. In such a functional block diagram, the test signal injection circuitry 144 is exemplified as acting at a node 1404 (for instance, at the output side of the stage 14).

For instance, the switch sw5 in FIG. 2 is essentially intended to highlight the fact that in the self-test (BIST) conditions, the contribution of the associated signal path is nil. Stated otherwise, the stage 1442 in FIG. 2 might be alternatively represented to include a single switch, namely sw4, configured to switch between 0 (normal functional or operational state) and Vbg1 (in the self-test or BIST state).

FIG. 3 provides a "transistor level" circuit diagram of a possible corresponding implementation of the basic concept underlying one or more embodiments as portrayed in FIG. 2. In the possible implementation exemplified in FIG. 3 the test signal injection circuitry 144 acts at the input nodes 141, 142, that is at the input side of the stage 14.

Also, a differential current is exemplified in FIG. 3 to flow at nodes 241, 242 (output from the stage 14/input to the ADC 16) with such a differential signal compared in the ADC 16 with a reference (current) $V_{bg2}/R$ coupled to both nodes. This is exemplified in FIG. 3 by representing the reference node 161 as two nodes 161a, 161b which facilitate coupling a differential reference current $V_{bg2}/R$ (for instance, input at 161a, output at 161b) to the ADC 16.

The transistor-level diagram of FIG. 3 is thus exemplary of possible implementations of the concept of injecting a differential current into the stage 14 in order to emulate an input differential voltage for test purposes.

That is, one or more embodiments as exemplified in FIG. 3 may be switched between an operational mode and a self-test (BIST) mode.

As noted, this may occur under the control of (for instance, internal) logic circuitry configurable to activate BIST for instance, on demand, in case of failure involving battery cell measurement (for instance, under/over voltage), at certain specified time intervals between two BIST acts, and so on, with BIST failure possibly transmitted to the control unit U.

In a normal operational mode of the circuit 10, the switches sw1 and sw2 are closed (that is, conductive with the switch sw3 open, namely non-conductive) while the switch(es) sw4 is/are open (non-conductive) with a switch sw5 (as presented—only—in FIG. 2) closed, that is, conductive.

In such a normal operational mode, the input terminals 121 and 122 are coupled to the input nodes 141 and 142 of the differential stage 14, respectively, while the current injection circuitry 144 is inactive so that the differential stage 14 applies to the input of the ADC 16 a (voltage) signal $V_{diff}$ which is a level-shifted replica of the input voltage DV.

In a self-test mode, the switches sw1 and sw3 are closed (conductive) with the switch sw2 open (non-conductive) while the current injection circuitry 144 is active with the switch(es) sw4 closed (conductive) and the switch sw5 (as presented—only—in FIG. 2) open, that is non-conductive. In such a self-test mode, the inputs 141, 142 to the differential stage 14 are shorted so that only the (high) common mode voltage HV is sensed while a differential current is forced via the circuitry 144 in order to emulate an input differential voltage making it possible to check a correct operation of the circuit 10.

Also, in one or more embodiments, the possibility exists in the self-test mode of selectively varying the intensity of the differential current forced via the circuitry 144. In that way, different values of an input differential voltage may be emulated, thus making it possible to check a correct operation of the circuit 10 over a whole possible range of input voltage DV (for instance, 0 to 5V), thus overcoming and intrinsic limitation of Zener-based solutions where a single value (as set by a Zener diode) can be used for test purposes.

As exemplified in the transistor-level circuit diagram of FIG. 3, the differential stage 14 may be configured to operate between a supply voltage Vb and ground with two current generators (of any known type) active to generate a current of intensity 2I between the supply voltage line at Vb and respective nodes A, B coupled—as discussed in the following—to (differential) output nodes 241, 242 of the differential stage 14 coupled to the input of the ADC 16.

As exemplified in the circuit diagram of FIG. 3, the nodes A and B are coupled to ground via current lines including a first transistor 34a and a second transistor 34b (for instance, MOSFET transistors) having their control terminals (gates, in the case of field effect transistor such as MOSFET transistors) driven via the output of two differential nodes (for instance, op-amps 141 and 142).

As exemplified in the circuit diagram of FIG. 3, the op-amp 141 has a first input (for instance, the non-inverting input) suited to be coupled to the input terminal 121 of the multiplexer 12 via the switch sw1, and a second input (for instance, the inverting input) shorted to the current path (for instance, the source terminal) of the transistor 34b at a point or node D.

As exemplified in the circuit diagram of FIG. 3, the op-amp 142 has a first input (for instance, the non-inverting input) suited to be coupled to the input terminal 122 of the multiplexer 12 via the switch sw2, and a second input (for instance, the inverting input) shorted to the current path (for instance, the source terminal) of the transistor 34a at point or node C.

In the case of the implementation of the current injection circuitry 144 exemplified in the circuit diagram of FIG. 3, a pair of switches sw4 shown in FIG. 3 may play the role exemplified by a single switch sw4 in the block diagram of FIG. 2 by facilitating (with the switches sw4 "on", namely conductive) coupling to the nodes C and D, and thus to the inverting inputs of the op-amps 141, 142 two current injection generators of intensity $V_{bg1}/nR$ (see, for direct reference, the stage 1440 with gain $1/nR$ in FIG. 2).

It will be otherwise appreciated that the two current injection generators $V_{bg1}/nR$ are coupled to the input nodes 141, 142 with opposite signs, so that one of the current generators (for instance, the one coupled to the input node 142) is shown to inject a current into the differential stage 14 while the other current generator (for instance, the one coupled with the input node 141) actually draws current from the stage 14.

In an implementation as exemplified in FIG. 3, two current generators (of any known type) are provided coupled between the nodes C and D and ground configured to sink from these nodes respective currents of intensity I, independently of the on/off condition of the switches sw4.

In an implementation as exemplified in FIG. 3, two further transistors 36a, 36b (for instance, MOSFET transistors) are provided in the same configuration as transistors 34a and 34b, so that the transistors 36a, 36b are able to read with low impedance the current sourcing this current into the nodes 241 and 242.

More specifically, the transistors 36a, 36b may be arranged with their current paths (source-drain in the case of field effect transistors such as MOSFET transistors) in respective current lines between the node A and the node 241 and the node B and the node 242. As exemplified herein the transistors 36a, 36b may be arranged with their control terminals (gates in the case of field effect transistors such as MOSFET transistors) set to a fixed voltage.

As shown, the nodes A and B are located in the current paths (source-drain in the case of field effect transistors such as MOSFET transistors) of the transistors 34a, 34b intermediate the transistors 34a, 34b and the current generators coupled to the supply line or rail at a voltage Vb providing to the nodes A and B currents of intensity 2I.

Reference 40 designates a common mode loop, which is a current generator set which is configured to sink currents of intensity I from the lines 241, 242 coupling the stage 14 with the ADC 16.

A stage as the one including the differential node (op-amp) 142 and the transistor 34a act essentially as a buffer by "copying" on the inverting or "minus" input of the op-amp the voltage on the non-inverting or "plus" terminal of the op-amp or, stated otherwise, by forcing to zero the difference of the voltages applied to the non-inverting and the inverting input of the op-amp.

As a consequence, whichever the mode activated (normal operational mode/BIST mode), the node C will be at the same voltage of the non-inverting input of the op-amp 142.

The same also applies to the stage including the differential node (op-amp) 141 and the transistor 34b, so that, whichever the mode activated (normal operational mode/BIST mode) the node D will be at the same voltage of the non-inverting input of the op-amp 141.

As a result, the following relationships will apply for the difference between the voltages V(C) and V(D) at the nodes C and D, respectively:

in the normal mode V(D)−V(C)=DV in the test (BIST) mode V(D)−V(C)=0.

It will be appreciated that the foregoing will apply as a result of the arrangement of the switches sw1, sw2 and sw3, independently of the setting (non-conductive/conductive) of the switches sw4.

Therefore the current $I_{R38}$ flowing through the resistor 38 will not be dictated by the behavior of the switches sw4 but will be given by the relationship $I_{R38}=[V(D)-V(C)]/5R$, so that in the normal mode it will be given by DV/5R while in the test mode it will be equal to zero (0/5R).

In an arrangement as exemplified in FIG. 3 transistors 34a, 34b, 36 a, 36b play the role of "current readers", configured to read the current at low impedance, that is, they still read the current on one node and replicate it on the other.

As noted, in the test (BIST) mode the current in the resistor 38 will be zero.

By applying Kirchoff's law at the node D, the current flowing in the transistor 34b will be equal to $I+(V_{bg1}/nR)$.

Likewise, by applying Kirchoff's law at the node C, the current flowing in the transistor 34a is equal to $I-(V_{bg1}/nR)$.

Similarly, the differential current entering the node 241 of stage 16 and leaving the node 242 of stage 16 can be read by applying Kirchoff's law at nodes A and B and the nodes 241 and 242.

In that way, the current flowing through the resistor 38 both when the switches sw4 are open (non-conductive: normal operational or functional mode) and when they are closed (conductive: self-test or BIST mode) is equal to the differential voltage between "C" and "D" (or equally between the two inverting inputs of the op-amps 141 and 142), divided by the resistance value of the resistor 38.

In one or more embodiments, the corresponding test signal injection circuitry 144, activated (for instance, by closing the switches sw4) has the effect to increase and decrease respectively the current flowing into the transistors 34a and 34b.

As noted, in an operational or functional mode, the switches sw4 and sw3 are open (non-conductive) and the switches sw1 and sw2 are closed (conductive) and the current flowing through the resistor 38 equals DV divided by 5R.

The transistor 34a will thus read a current equal to I+(DV/5R) and the transistor 34b a current equal to I–(DV/5R).

As a result, in a normal operational mode, the transistor 36a will read a current equal to 2I–(I–DV/5R)=I+(DV/5R) and the transistor 36b a current equal to 2I–(I+DV/5R)=I–(DV/5R).

In a normal operational mode, the current at node 242 at 16 will be is equal to I–(DV/5R)–I=–(DV/5R) and the current at node 241 at 16 will be equal to I+(DV/5R)–I=+(DV/5R).

Finally the ADC 16 will produce at its output a bitstream having an average value (as calculated by the digital filter 18) proportional to the ratio of the input differential current (DV/5R) to a reference signal which is a function of the bandgap $V_{bg2}/R$.

Conversely, in a test (BIST) mode, the switches sw1, sw3 and sw4 are closed (conductive or "on"), and the switch sw2 is open (non-conductive or "off"). The current flowing through the resistor 38 will be zero (a zero voltage divided by 5R).

With the switches sw4 conductive ("on"), a current equal to $V_{bg1}/nR$ will be read by the transistors 34a and 34b, which will in fact read I–($V_{bg1}/nR$) and I+($V_{bg1}/nR$), respectively.

The transistors 36a, 36b will in turn read a current equal to 2I–(I–($V_{bg1}/nR$))=I–F($V_{bg1}/nR$) and 2I–(I+($V_{bg1}/nR$))=I–($V_{bg1}/nR$).

As a consequence, in a test (BIST) mode, the current at node 242 at 16 will be equal to I–($V_{bg1}/nR$)–I=–($V_{bg1}/nR$) and the current at node 241 at 16 will be equal to I+($V_{bg1}/nR$)–I=+($V_{bg1}/nR$).

Correspondingly, the ADC 16 will produce at its output a bitstream having an average value (calculated by the filter 18) proportional to the ratio of the input differential current ($V_{bg1}/nR$) to a reference signal which is a function of the bandgap $V_{bg2}/R$.

Since the two bandgap voltage references are (notionally) identical, the ratio of $V_{bg1}/nR$ to $V_{bg2}/R$ is equal to 1/n.

In BIST mode, the output CODE can be evaluated in this way:

$$\text{CODE}=[(V_{bg2}/R)/(V_{bg1}/nR)]*2^{\wedge}\text{mbit}=(1/n)*2^{\wedge}\text{mbit}.$$

In that way, modulating the ratio of R to nR (that is the factor n) facilitates obtaining a gamut of possible output bitstreams and codes, which in turn facilitates "exploring" an input characteristic, e.g., from 0 up to 5V.

For instance, in the test (BIST) mode, a "true" input differential voltage will be emulated via a relationship of the kind $DV_{equivalent}=n*V_{bg1}$.

One or more embodiments may thus provide the possibility of selectively varying the intensity of the current forced (injected) into the stage 14 in the self-test mode.

In possible implementations as exemplified in FIG. 3, this may occur, for instance, by partitioning by a factor n the $V_{bg1}/R$ current and selectively changing the value of the current $V_{bg1}/nR$ (see also the gain stage 1440 in FIG. 2).

Exploiting this solution, self-test is no longer limited to a single point as is the case of conventional Zener-based solutions.

That is, one or more embodiments facilitate modulating the current $V_{bg1}/nR$, thus emulating an input voltage difference varying between expected minimum and maximum values.

One or more embodiments may rely on the possible presence of the three switches sw1, sw2 and sw3 in the multiplexer 12 with the switch sw3 closed in the self-test state.

In principle, the switch sw3 alone might suffice to short-circuit the nodes 141, 142 in the self-test mode.

However, with (only) the sw3 closed, the nodes (for instance, op-amps) 141 and 142 would be floating. This may not be desirable insofar as this would lead to testing the circuit under a different condition with respect to the functional one. For that reason, one or more embodiments as discussed herein may contemplate that another switch (for instance, the switch sw1 as discussed previously, but the same may apply to the switch sw2) can be closed to facilitate keeping the inputs (for instance, the non-inverting nodes of the two op-amps 141 and 142) at a same, well defined voltage.

For instance, with sw1 closed (conductive), with sw3 also closed, the voltage at node 121 is applied to the nodes C and D (see FIG. 3).

This facilitates correct operation of the op-amps 141 and 142 in the self-test mode in conditions (HV) corresponding to the operational or functional mode, also facilitating testing correct operation of the op-amps 141, 142. For instance, defective operation the op-amp 141 may result in the inability to "copy" the voltage on pin 121 on node D: the current in the resistor 38 will be different from zero, and the differential current in the ADC 16 will not be the expected one (with a corresponding error in the code at the output of the filter 18).

In one or more embodiments, the multiplexer 12 may thus be is configured (via the switches sw1, sw2) to couple the first input node 141 and the second input node 142 of the differential stage 14 (with these input nodes coupled—that is, short circuited—in the self-test mode by the test switch sw3 in the conductive state) to one (for instance, 121) of the first 121 and second 122 input terminals 122 of the multiplexer.

One or more embodiments as exemplified herein, where the multiplexer 12 comprises three switches (namely sw1, sw2 and sw3), correspond to a desirable solution for balance purposes.

It will be otherwise appreciated that, in one or more embodiments, the multiplexer 12 may comprise, in addition to the "test" switch sw3, intended to short-circuit the nodes 141, 142 of the stage 14 in the self-test mode, only one of the switches sw1, sw2.

This can be understood by noting that, in operation as exemplified herein, the normal operational mode contemplates making the switches sw1 and sw2 conductive (so that the signal DV is transferred from the input terminals 121, 122 of the multiplexer 12 to the input nodes 141, 142 of the differential stage 14) and the test switch sw3 non-conductive (with the input nodes 141, 142 mutually isolated to receive the signal DV therebetween).

In addition, the test (BIST) mode contemplates making the switches sw1 and sw3 conductive and the switch sw2 non-conductive, so that the test switch sw3 short circuits the input nodes 141, 142 of the stage 14 with these nodes (141 and 142, mutually coupled by the test switch sw3 in the conductive state) coupled to one of the input terminals (e.g., 121) of the multiplexer 12 by the switch sw1, while the switch sw2 is non-conductive and de-couples the input nodes 141, 142 of the stage 14 (short circuited by the switch sw3) from the other of the input terminals (e.g., 122) of the multiplexer 12.

In such an embodiment, the switch sw1 (conductive both in the normal operational mode and in the test or BIST mode) could therefore be dispensed with, thus giving rise to a two-switch structure (sw2, sw3) of the multiplexer 12.

As noted previously, the test or BIST mode might alternatively contemplate making the switches sw2 and sw3 conductive and the switch sw1 non-conductive, so that the test switch sw3 short circuits the input nodes 141, 142 of the stage 14 with these nodes (141 and 142, mutually coupled by the test switch sw3 in the conductive state) coupled to one of the input terminals (e.g., 122) of the multiplexer 12 by the switch sw2, while the switch sw1 is non-conductive and de-couples the input nodes 141, 142 of the stage 14 (short circuited by the switch sw3) from the other of the input terminals (e.g., 121) of the multiplexer 12.

In such an embodiment, the switch sw2 (conductive both in the normal operational mode and in the test or BIST mode) could therefore be dispensed with, again giving rise to a two-switch structure (sw1, sw3) of the multiplexer 12.

In one or more embodiments, the multiplexer 12 may thus comprise, in addition to the "test" switch sw3 (intended to short-circuit the nodes 141, 142 in the self-test mode), only one of the switches sw1, sw2, namely one further switch (sw1 or sw2) switchable to a non-conductive state to decouple the first input node 141 and the second input node 142 of the differential stage 14 (which are coupled by the test switch sw3 in the conductive state in the self-test mode) from the other 122 of the first 121 and second 122 input terminals of the multiplexer 12.

In one or more embodiments as exemplified herein, the multiplexer 12 comprises a three-switch arrangement and includes, in addition to the "test" switch sw3, a first switch (namely, sw1) and a second switch (namely, sw2) which are switchable to a conductive state to couple the first input terminal 121 and the second input terminal 122 of the multiplexer 12 to the first input node 141 and the second input node 142 of the differential stage 14, respectively.

In one or more embodiments as exemplified herein, the multiplexer 12 is thus selectively switchable between an operational mode, with the first switch sw1 and the second switch sw2 in the conductive state and the test switch sw3 in the non-conductive state, and a self-test mode, with the test switch sw3 and one (for instance, 121) of the first 121 and second 122 switches in the conductive state and the other (for instance, 122) of the first 121 and second 122 switches in the non-conductive state.

Embodiments as discussed herein facilitate a thorough testing of various elements in a circuit layout as exemplified in FIG. 3.

Just be way of non-limiting example, one may assume that correct, expected operation may correspond to a certain value for the CODE signal at the output of the filter 18, lying within a certain "window" between a lower threshold th_low and upper thresholds th_high (say a value "77", lying between 76 and 78 taken as the lower and upper thresholds).

A control logic (which may be regarded as included in the processing applications designated P in FIG. 1 sensitive to CODE) may thus perform a check of the type ---
if (CODE> th_low && CODE <th_high) >>> do nothing
else >>> ERROR.
--- and, in the latter case, the failure can be communicated to a controller (for instance, U in FIG. 1).

One or more embodiments may exhibit a good flexibility in adopting a self-test (BIST) procedure as discussed previously.

For instance, an under-voltage (that is a cell having a lower voltage than expected) being detected—in a manner know per se—in normal operation may lead to malfunctioning of the BMS (and specifically of the circuit 10) being suspected.

The controller U may thus activate (automatically) a self-test/BIST mode.

If the BIST does not fail (that is the BMS is found to operate correctly), the cell under-voltage (damage) can be confirmed.

If, conversely, the BIST fails, malfunctioning of the circuit 10 can be confirmed and appropriate action taken.

Embodiments as discussed herein facilitate a thorough testing of various elements in a circuit layout as exemplified in FIG. 3, in that incorrect operation of at least one of the components may almost invariably result in BIST failure.

Embodiments as discussed herein facilitate a thorough testing of various elements in a circuit layout as exemplified in FIG. 3.

For instance, op-amps 141 and 142 can be tested during the BIST act discussed previously in view of their role as buffers.

The switches in the multiplexer 12 can be similarly tested in view of their expected positioning in certain defined on-off (conductive/non-conductive) states.

Also the various transistors are tested in view of their expected role in reading currents.

The ADC 16 and the filter 18 can be checked in terms of their ability to perform the tasks allotted thereto.

For instance, a failure in the ADC 16 or the filter 18 will expectedly result in a random value generated for CODE.

For instance, if any of the MOS transistors or one of the reference currents (bandgaps) does not operate correctly, the differential current in the ADC 16 will be different from the expected current.

For instance, failure of one of the op-amps 141, 142 may result, as discussed previously in a current in the resistor 38 different from zero; the differential current in the ADC 16 will not the expected one, with a corresponding error in CODE at the output of the filter 18.

For instance, failure any of the switches sw4 or one of their associated (for instance, bandgap) generators will lead to a differential current in the ADC 16 different from the expected one, with BIST again failed.

For instance, failure of sw3 (unable to close, that is to become conductive) will result in the non-inverting inputs of the op-amps 141 and 142 being at different voltages, with this situation mirrored at nodes C and D and a current in the resistor 38 different from zero; the differential current in the ADC 16 will not the expected one, with a corresponding error in CODE at the output of the filter 18 and BIST again failed.

For instance, failure of sw1 leading to sw1 being always closed, that is always conductive, may lead to a situation where (by considering sw2 always closed, that is conductive, both in the functional and in the test or BIST mode) with sw3 closed in the test mode and sw1—erroneously—always closed, a current I=Vcell/3R (where Vcell is the cell voltage and 3R is representative of the resistance across the switches) will follow through sw1, sw2, sw3, thus causing a non-nil voltage drop, e.g., Vcell/3R*R=Vcell/3, across sw3. For instance, with Vcell=3V, a voltage drop V(sw3)= 1V will develop across sw3, with the non-inverting inputs of the op-amps 141 and 142 being at different voltages, with this situation mirrored at nodes C and D and a current in the resistor 38 different from zero: the differential current in the ADC 16 will not the expected one, with a corresponding error in CODE at the output of the filter 18 and BIST again failed.

For instance, failure of sw1 leading to sw1 being always open, that is non-conductive, can be detected by open-circuit diagnostics known to the skilled in the art or by resorting to an arrangement disclosed in a co-pending Italian patent application filed on even date in the name of the same applicant.

The area used for the additional functions discussed previously is small and essentially related to the switches sw4 and the current generators $V_{bg1}/nR$ (which, operate at a low voltage).

A circuit (for instance, 10) according to one or more embodiments may comprise a differential stage (for instance, 14) having a first input node (for instance, 141) and a second input node (for instance, 142), the differential stage having a first output node (for instance, 241) and a second output node (for instance, 242) configured to provide a differential output signal (for instance, $V_{diff}$) therebetween. An analog-to-digital converter (for instance, 16) is coupled to the first and second output nodes of the differential stage. The analog-to-digital converter is configured to provide an output signal (for instance, Vout) that is a function of the differential output signal from the differential stage. A multiplexer (for instance, 12) comprises a first input terminal (for instance, 121) and a second input terminal (for instance, 122) configured to receive a differential input signal (for instance, DV) therebetween as well as a test switch (for instance, sw3) switchable between a conductive state and a non-conductive state. The test switch in the conductive state couples (short-circuits) the first input node and the second input node of the differential stage. Test signal injection circuitry (for instance, 144, 1440, sw4; $V_{bg1}/nR$, sw4) is activatable (for instance, via the switches sw4) to force (for instance, 1404; 141, 142) a differential current through the differential stage.

The circuit is selectively switchable between an operational mode and a self-test mode. In the operational mode, the test switch is in the non-conductive state and the multiplexer is configured to transfer the differential input signal to the first input node and the second input node of the differential stage and the test signal injection circuitry inactive. The differential output signal from the differential stage comprises a (for instance, level-shifted) replica of the differential input signal. In the self-test mode, the test switch is in the conductive state and the test signal injection circuitry is active. The differential output signal from the differential stage is a function of the differential current forced through the differential stage by the test signal injection circuitry.

In one or more embodiments, the multiplexer may be configured (for instance, via the switches sw1, sw2) to couple the first input node and the second input node of the differential stage (which, in the self-test mode can be coupled by the test switch in the conductive state) to one (for instance, 121) of the first and second input terminals (of the multiplexer).

In one or more embodiments, the multiplexer may comprise a two-switch multiplexer comprising, for instance, in addition to the switch sw3, at least one further switch (for instance, sw1 and/or sw2) switchable to a non-conductive state to decouple the first input node and the second input node of the differential stage coupled by the test switch in the conductive state in the self-test mode from the other of the first and second input terminals (of the multiplexer).

In one or more embodiments, the multiplexer may comprise a first switch (for instance, sw1) and a second switch (for instance, sw2) switchable to a conductive state to couple the first input terminal and the second input terminal of the multiplexer to the first input node and the second input node of the differential stage. The multiplexer may be selectively switchable between: the operational mode, with the first switch and the second switch in the conductive state and the test switch in the non-conductive state, and the self-test mode, with the test switch and one (for instance, 121) of the first and second switches in the conductive state and the other (for instance, 122) of the first and second switches in the non-conductive state.

In one or more embodiments, the test signal injection circuitry may be configured to selectively vary (for instance, by "modulating" the value for n) the intensity (for instance, $V_{bg1}/nR$) of the current through the differential stage.

In one or more embodiments, the test signal injection circuitry may comprise first and second test signal generators (for instance, $V_{bg1}/nR$) selectively couplable (for instance, via the switches sw4 in FIG. 3) to the first input node and the second input node of the differential stage.

In one or more embodiments, the differential stage may comprises two differential amplifiers (for instance, 141, 142) arranged with first inputs selectively couplable (for instance, via the switches sw1, sw2) to the first input terminal and the second input terminal of the multiplexer, respectively, and second inputs selectively couplable (for instance, via the switches sw4) to the first and second test signal generators ($V_{bg1}/nR$), respectively.

In one or more embodiments the first and second test signal generators may comprise bandgap generators.

One or more embodiments may comprise a sigma-delta analog-to-digital converter (for instance, 16) coupled to the first and second output nodes of the differential stage, the sigma-delta analog-to-digital converter having a reference input (for instance, of a differential type) configured to receive a reference signal (for instance, a differential reference current $V_{bg2}/R$ input at 161a, output at 161b) and an output node, the sigma-delta analog-to-digital converter configured to provide at its output node a bitstream (for instance, $V_{out}$) having an average value (CODE) which is a function of the ratio of the differential output signal from the differential stage to the reference signal.

One or more embodiments may comprise a digital filter (for instance, 18) coupled to the output node of the sigma-delta analog-to-digital converter to receive therefrom the bitstream and calculate the average value thereof.

One or more embodiments may comprise a reference signal generator (for instance, $V_{bg2}/R$) coupled to the reference input of the sigma-delta analog-to-digital converter, wherein the reference signal generator ($V_{bg2}/R$) comprises a bandgap generator.

In one or more embodiments, a device may comprise a circuit according to one or more embodiments, and a differential signal source coupled to the circuit between the first input terminal and the second input terminal of the multiplexer in the circuit.

In one or more embodiments, the differential signal source may comprise an electrical battery cell.

In one or more embodiments an electrically-propelled vehicle (for instance, V) may comprise an electrical battery pack (for instance, BP), wherein at least one battery cell (for instance, C) in the battery pack is equipped with a circuit according to one or more embodiments, the at least one battery cell coupled to the circuit between the first input terminal and the second input terminal of the multiplexer of the circuit.

A method of operating a circuit according to one or more embodiments may comprise (for instance, U) the circuit between the operational mode, with the test switch in the non-conductive state, with the test signal injection circuitry inactive, wherein the differential output signal from the differential stage comprises a (for instance, level-shifted) replica of the differential input signal, and the self-test mode, with the test switch in the conductive state, with the test signal injection circuitry active. The differential output signal from the differential stage is a function of the differential current forced through the differential stage by the test signal injection circuitry.

One or more embodiments may comprise selectively varying (for instance, by "modulating" the value for n) the intensity (for instance, $V_{bg1}/nR$) of the current forced through the differential stage by the test signal injection circuitry with the circuit switched to the self-test mode.

Without prejudice to the underlying principles, the details and embodiments may vary, even significantly, with respect to what has been described by way of example only, without departing from the extent of protection.

The extent of protection is determined by the annexed claims.

What is claimed is:

1. A circuit, comprising:
a differential stage having a first input node and a second input node, the differential stage having a first output node and a second output node configured to provide a differential output signal therebetween;
an analog-to-digital converter coupled to the first and second output nodes of the differential stage, the analog-to-digital converter configured to provide an output signal that is a function of the differential output signal from the differential stage;
a multiplexer comprising a first input terminal and a second input terminal configured to receive a differential input signal therebetween, the multiplexer also comprising a test switch switchable between a conductive state and a non-conductive state, wherein the test switch in the conductive state couples the first input node and the second input node of the differential stage; and
test signal injection circuitry activatable to force a differential current through the differential stage,
wherein the circuit is selectively switchable between an operational mode and a self-test mode,
wherein, in the operational mode, the test switch is in the non-conductive state and the multiplexer is configured to transfer the differential input signal to the first input node and the second input node of the differential stage and the test signal injection circuitry is inactive, wherein the differential output signal from the differential stage comprises a replica of the differential input signal, and
wherein, in the self-test mode, the test switch is in the conductive state and the test signal injection circuitry is active, wherein the differential output signal from the differential stage is a function of the differential current forced through the differential stage by the test signal injection circuitry.

2. The circuit of claim 1, wherein the multiplexer is configured to couple the first input node and the second input node of the differential stage coupled in the self-test mode by the test switch in the conductive state to one of the first and second input terminals.

3. The circuit of claim 2, wherein the multiplexer comprises a further switch switchable to a non-conductive state to decouple the first input node and the second input node of the differential stage coupled by the test switch in the conductive state in the self-test mode from the other of the first and second input terminals.

4. The circuit of claim 2, wherein the multiplexer comprises a first switch and a second switch switchable to a conductive state to couple the first input terminal and the second input terminal of the multiplexer to the first input node and the second input node of the differential stage, respectively.

5. The circuit of claim 4, wherein the multiplexer is selectively switchable between:
the operational mode, with the first switch and the second switch in the conductive state and the test switch in the non-conductive state; and
the self-test mode, with the test switch and one of the first and second switches in the conductive state and the other of the first and second switches in the non-conductive state.

6. The circuit of claim 1, wherein the test signal injection circuitry is configured to selectively vary an intensity of the differential current through the differential stage.

7. The circuit of claim 1, wherein the test signal injection circuitry comprises first and second test signal generators selectively couplable to the first input node and the second input node of the differential stage.

8. The circuit of claim 7, wherein the differential stage comprises two differential amplifiers arranged with:
first inputs selectively couplable to the first input terminal and the second input terminal of the multiplexer, respectively; and
second inputs selectively couplable to the first and second test signal generators, respectively.

9. The circuit of claim 7, wherein the first and second test signal generators comprise bandgap generators.

10. The circuit of claim 1, wherein the analog-to-digital converter comprises a sigma-delta analog-to-digital converter coupled to the first and second output nodes of the differential stage, the sigma-delta analog-to-digital converter having a reference input configured to receive a reference signal and an output node, the sigma-delta analog-to-digital converter being configured to provide at its output node a bitstream having an average value that is a function of a ratio of the differential output signal from the differential stage to the reference signal.

11. The circuit of claim 10, further comprising a digital filter coupled to the output node of the sigma-delta analog-to-digital converter to receive therefrom the bitstream and calculate the average value thereof.

12. The circuit of claim 10, further comprising a reference signal generator that is configured to generate the reference signal and is coupled to the reference input of the sigma-delta analog-to-digital converter, wherein the reference signal generator comprises a bandgap generator.

13. The circuit of claim 1, further comprising a differential signal source coupled to the circuit between the first input terminal and the second input terminal of the multiplexer in the circuit.

14. The circuit of claim 13, wherein the differential signal source comprises an electrical battery cell.

15. An electrically-propelled vehicle comprising:
an electrical battery pack including a plurality of battery cells;
a differential stage having a first input node and a second input node, the differential stage having a first output node and a second output node configured to provide a differential output signal therebetween;
an analog-to-digital converter coupled to the first and second output nodes of the differential stage, the analog-to-digital converter configured to provide an output signal that is a function of the differential output signal from the differential stage;
a multiplexer having a first input terminal and a second input terminal that is coupled to one of the battery cells of the electrical battery pack, wherein the multiplexer comprises a test switch switchable between a conductive state and a non-conductive state, wherein the test switch in the conductive state couples the first input node and the second input node of the differential stage;
test signal injection circuitry activatable to force a differential current through the differential stage;
wherein the test signal injection circuitry is selectively switchable between an operational mode and a self-test mode;
wherein, in the operational mode, the test switch is in the non-conductive state and the multiplexer is configured to transfer a differential input signal to the first input node and the second input node of the differential stage and the test signal injection circuitry is inactive, wherein the differential output signal from the differential stage comprises a replica of the differential input signal; and
wherein, in the self-test mode, the test switch is in the conductive state and the test signal injection circuitry is active, wherein the differential output signal from the differential stage is a function of the differential current forced through the differential stage by the test signal injection circuitry.

16. A method of operating a circuit, wherein:
the circuit comprises:
a differential stage having a first input node and a second input node, the differential stage having a first output node and a second output node configured to provide a differential output signal therebetween;
an analog-to-digital converter coupled to the first and second output nodes of the differential stage, the analog-to-digital converter configured to provide an output signal that is a function of the differential output signal from the differential stage;
a multiplexer comprising a first input terminal and a second input terminal configured to receive a differential input signal therebetween, the multiplexer also comprising a test switch switchable between a conductive state and a non-conductive state, wherein the test switch in the conductive state couples the first input node and the second input node of the differential stage; and,
test signal injection circuitry activatable to force a differential current through the differential stage;
the method comprises switching the circuit between:
an operational mode, with the test switch in the non-conductive state and the multiplexer configured to transfer the differential input signal to the first input node and the second input node of the differential stage and the test signal injection circuitry is inactive, wherein the differential output signal from the differential stage comprises a replica of the differential input signal; and
a self-test mode, with the test switch in the conductive state and the test signal injection circuitry active, wherein the differential output signal from the differential stage is a function of the differential current forced through the differential stage by the test signal injection circuitry.

17. The method of claim 16, comprising selectively varying an intensity of the differential current forced through the differential stage by the test signal injection circuitry with the circuit switched to the self-test mode.

18. The method of claim 16, further comprising providing a bitstream having an average value that is a function of a ratio of the differential output signal from the differential stage to a reference signal.

19. The method of claim 18, further comprising calculating an average value of the bitstream.

20. The method of claim 18, further comprising generating the reference signal using a bandgap generator, the bitstream being output a sigma-delta analog-to-digital converter coupled to the bandgap generator.

21. The electrically-propelled vehicle of claim 15, wherein the test signal injection circuitry is configured to selectively vary an intensity of the differential current through the differential stage.

* * * * *